(12) United States Patent
Ye et al.

(10) Patent No.: US 6,683,506 B2
(45) Date of Patent: Jan. 27, 2004

(54) CMOS PHASE LOCKED LOOP WITH VOLTAGE CONTROLLED OSCILLATOR HAVING REALIGNMENT TO REFERENCE AND METHOD FOR THE SAME

(75) Inventors: Sheng Ye, La Jolla, CA (US); Ian Galton, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 17 days.

(21) Appl. No.: 10/051,378

(22) Filed: Jan. 18, 2002

(65) Prior Publication Data

US 2003/0137357 A1 Jul. 24, 2003

(51) Int. Cl.$^7$ .............................................. H03B 27/00
(52) U.S. Cl. ............................. 331/57; 331/18; 331/25; 327/156
(58) Field of Search .............................. 331/57, 18, 25; 327/156, 157, 158, 159

(56) References Cited

U.S. PATENT DOCUMENTS

| | | | |
|---|---|---|---|
| 5,777,520 A | * | 7/1998 | Kawakami ................... 331/1 R |
| 5,847,617 A | | 12/1998 | Reddy et al. |
| 6,121,810 A | | 9/2000 | Philpott |
| 6,148,052 A | | 11/2000 | Bogdan |
| 6,208,183 B1 | | 3/2001 | Li et al. |
| 6,466,100 B2 | * | 10/2002 | Mullgrav, Jr. et al. ...... 331/179 |

OTHER PUBLICATIONS

Silicon Wave SiW 1502 Bluetooth Radio Modem IC Data Sheet, Nov. 3, 2000.
G. Chien, P.R. Gray, "A 900–MHz Local Oscillator Using a DLL–Based Frequency multiplier Technique for PCS Applications", *ISSCC Digest of Technical Papers*, pp. 202–203, Feb., 2000.
F. Gardner, "Charge–Pump phase–lock loops", IEEE Trans. Comm., vol. COM–28, No. 11, pp. 1849–1858, Nov. 1980.
S. Ye, L. Jansson, I. Galton, " A multiple–crystal interface PLL with VCO realignment to reduce phase noise," IEEE International Solid–State Circuits Conference, pp. 78–79, 446, Feb., 2002.

* cited by examiner

*Primary Examiner*—Henry Choe
(74) *Attorney, Agent, or Firm*—Greer, Burns & Crain, Ltd.

(57) ABSTRACT

A periodic controlled realignment of the ring oscillator VCO in a phase locked loop is used to effect phase correction in a CMOS phase locked loop. A realignment to a buffered version of the reference signal is conducted periodically, at a time when an edge of the VCO waveform would ideally coincide with an edge in the reference signal. A preferred embodiment CMOS phase locked loop of the invention uses a ring oscillator voltage controlled oscillator. A divide by M circuit is driven by an output of the voltage controlled oscillator. A control voltage circuit accepts a reference signal and a signal from the divide by M circuit, and produces a control voltage proportional to a phase difference between the output of the voltage controlled oscillator and the reference signal to control the voltage controlled oscillator. A realignment circuit responsive to the reference signal provides a realignment signal into the voltage controlled oscillator when an edge in the waveform of the voltage controlled oscillator ideally coincides with an edge of the reference signal.

10 Claims, 7 Drawing Sheets

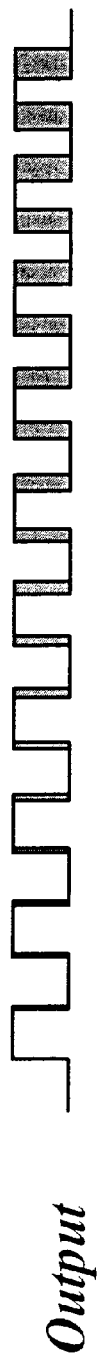
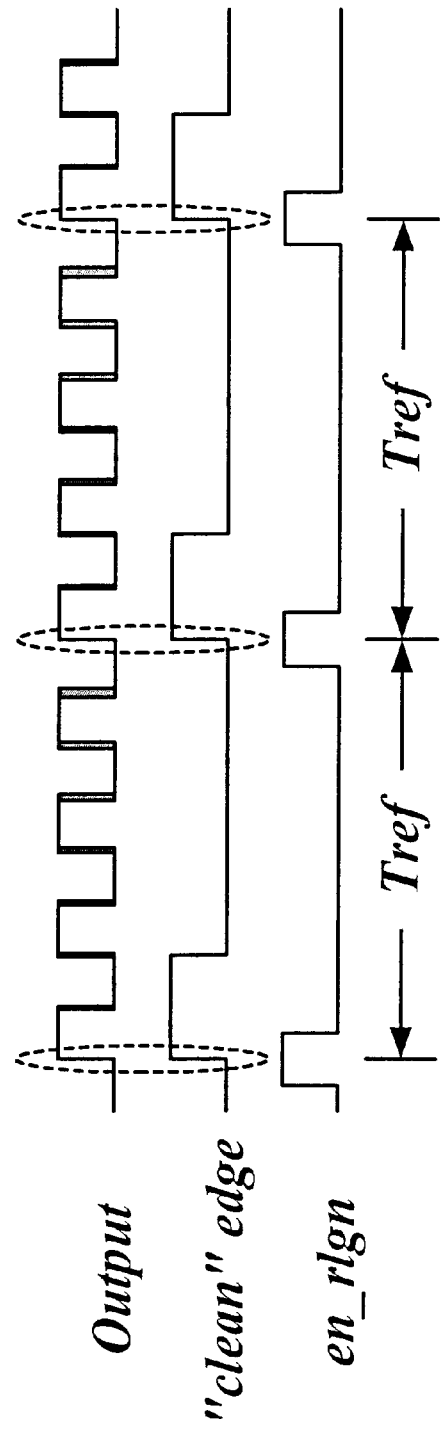
FIG. 2A
FIG. 2B
FIG. 2C
FIG. 2D

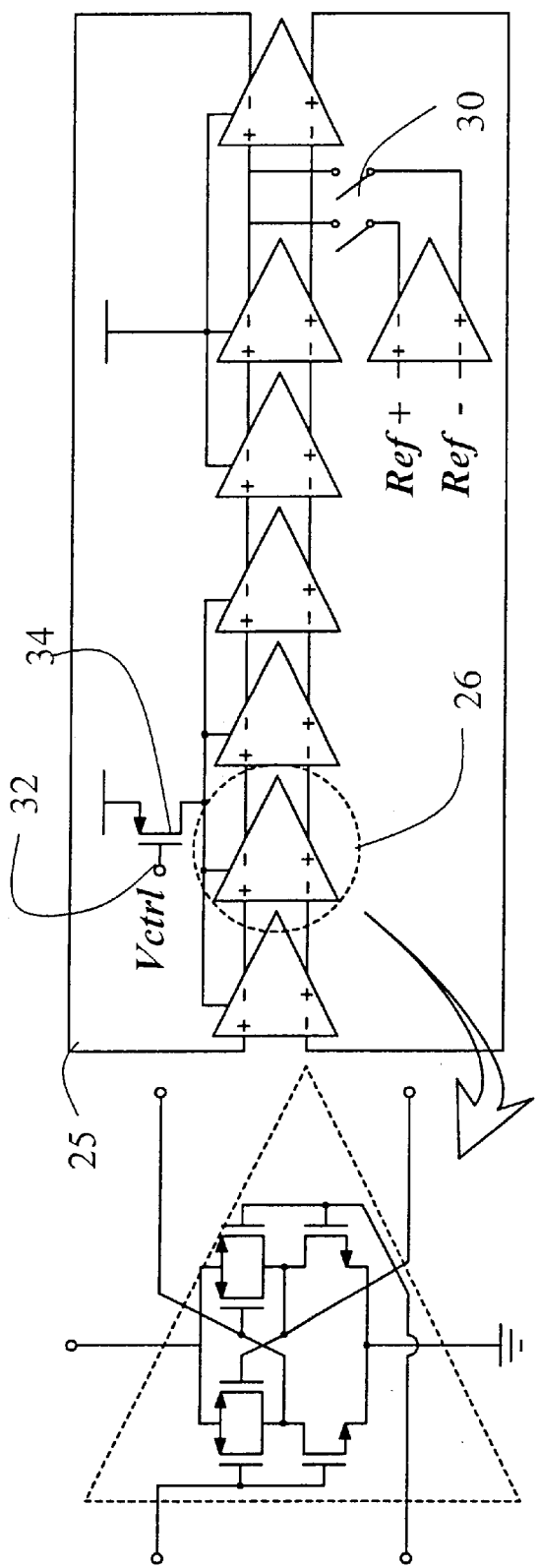
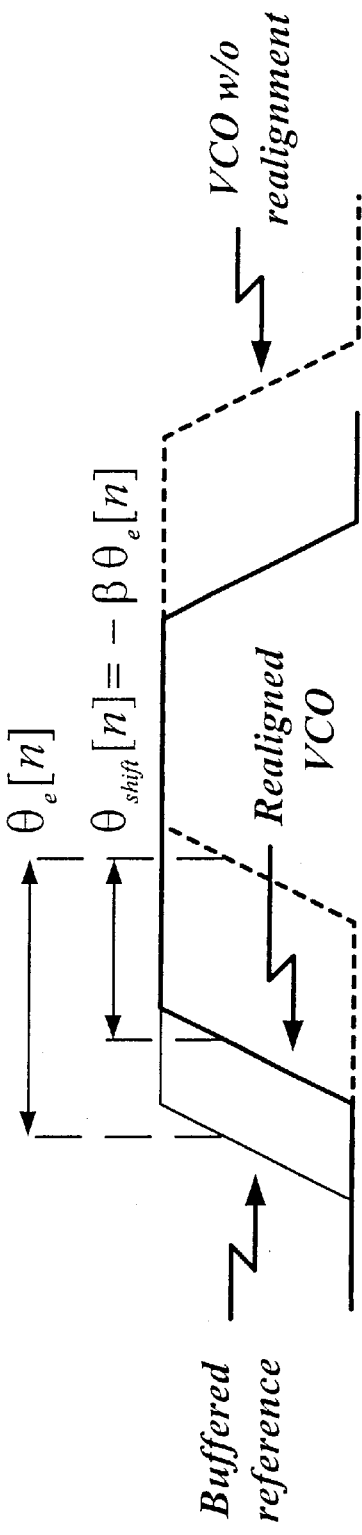
FIG. 3A
FIG. 3B
FIG. 3C

| Technology | 0.35 μm BiCMOS SOI (with only CMOS components used) |
|---|---|
| Supply voltage | 2.7-3.3V (measurements at 3V) |
| Total power consumption | 6.8mW (no observable difference when realignment enabled) |
| Die size | 1.8 mm² |
| Realigned PLL core area | 0.22 mm². Conventional PLL: 73% Realignment circuitry: 27% |
| Spot noise @ 20KHz Offset (25kHz PLL bandwidth) | -92.5 dBc/Hz (realignment disabled) -102.5 dBc/Hz (realignment enabled) |
| Reduction of integrated noise power from 1 kHz - 50 kHz | 8.3 dB w/ 25 kHz PLL bandwidth 5.3 dB w/ 50 kHz PLL bandwidth |

FIG. 6B

CMOS PHASE LOCKED LOOP WITH VOLTAGE CONTROLLED OSCILLATOR HAVING REALIGNMENT TO REFERENCE AND METHOD FOR THE SAME

FIELD OF THE INVENTION

The invention is in the microelectronics field. The invention is applicable to devices that have circuits operating in synchronization with a reference oscillator, typically a crystal. The invention is particularly applicable to reduce voltage controlled oscillator phase noise in very high frequency phase locked loops.

BACKGROUND OF THE INVENTION

A recent trend is toward the combination of oscillator driven devices into a single device. Wireless transceivers requiring an oscillator reference frequency might be combined with a computer or portable device having a highly different oscillator reference. In devices having multiple wireless communication functions, distinct communication functions may require highly different operational frequencies. For example, a cell phone has a distinct frequency range of operation, whereas a wireless local area network (LAN) or other network may have a considerably different range of operation. The combination of a LAN communication function and cellular network communication function may require the use of separate crystals for generation of separate operational frequencies. Similarly, a LAN may be combined with another microprocessor driven device, e.g., a computer, having a distinct reference oscillation frequency. As an additional particular example, Bluetooth and the IEEE 802.11 communication standards have been identified as being desirable to combine into computers, peripherals and devices having a different wireless transceiver function. The eventual market penetration of such low-end local area networks will be affected by transceiver price.

Bluetooth is a particular example having current market interest that is affected by price considerations. A Bluetooth transceiver is approaching the five dollar level. This renders the price of an external crystal for basing Bluetooth communications a significant expense. A cost reduction may be achieved by basing Bluetooth communications on another crystal reference offered by a device into which the Bluetooth transceiver is incorporated, e.g., a cell phone, a computer or a personal digital assistant (PDA). This allows the Bluetooth transceiver to share the same reference as the host device, and is particularly advantageous in wireless host devices. A wireless host device, such as a cell phone, is often sensitive to interference at the circuit board level from oscillator signals outside of its operational frequency. Accordingly, an additional potential advantage of having a Bluetooth transceiver share the host transceiver reference is the potential of a reduced interference with primary operations of the host device.

The required oscillation signal for a transceiver reference is typically generated by a phase locked loop (PLL). A phase locked loop controls an oscillator having less precision and stability than the reference signal to maintain a constant phase angle relative to a reference signal, e.g., a host crystal reference signal. Use of a high frequency oscillator permits the development of a transceiver reference signal at higher frequency than the host crystal reference signal.

The critical oscillator in a wireless transceiver, e.g., a Bluetooth or IEEE 802.11 transceiver, is the oscillator used to drive the radio frequency (RF) mixers. A number of local oscillator signals at particular frequency increments are generally required over a frequency range. The various required frequencies could be generated from any of the popular crystal frequencies by a fractional-N RF PLL, but flexibility required to accommodate the necessary crystal frequencies would translate into significant added circuit area and power consumption. An integer-N RF PLL is better from a circuit area and power consumption standpoint, but requires a reference PLL capable of generating a reference signal of a particular frequency, e.g., the frequency increments over the frequency range, with very little phase noise from any of the crystal frequencies.

The trend in wireless transceiver design is to integrate the whole system in CMOS technology. A suitable voltage controlled oscillator (VCO) in a CMOS PLL is a ring oscillator VCO since it avoids external components. Ring oscillator based PLL's are typically noisy, though, and therefore present considerable design challenges. Accordingly, there remains a need for an improved CMOS phase locked loop.

SUMMARY OF THE INVENTION

The present invention addresses these and other issues, with a periodic controlled realignment of the ring oscillator VCO in a phase locked loop. A realignment to a buffered version of the reference signal is conducted periodically, at a time when an edge of the VCO waveform would ideally coincide with an edge in the reference signal.

A preferred embodiment CMOS phase locked loop of the invention uses a ring oscillator voltage controlled oscillator. A divide by M circuit is driven by an output of the voltage controlled oscillator. A control voltage circuit accepts a reference signal and a signal from the divide by M circuit, and produces a control voltage proportional to a phase difference between the output of the voltage controlled oscillator and the reference signal to control the voltage controlled oscillator. A realignment circuit responsive to the reference signal provides a realignment signal into the voltage controlled oscillator when an edge in the waveform of the voltage controlled oscillator ideally coincides with an edge of the reference signal.

BRIEF DESCRIPTION OF THE DRAWINGS

FIG. 2A is a waveform illustrating accumulation of error in a conventional CMOS ring oscillator VCO;

FIGS. 2B–2D are waveforms illustrating a realignment effected by the method of the invention;

FIG. 3A is a simplified block diagram of an exemplary VCO with realignment in accordance with the principles of the invention;

FIG. 3B is a circuit schematic for an inverter in the exemplary VCO;

FIG. 3C is a waveform from circuit simulation and experimental measurements of the exemplary VCO;

FIG. 6B is a performance summary concerning the exemplary physical embodiment phase locked loop shown in FIG. 6A.

DETAILED DESCRIPTION OF THE PREFERRED EMBODIMENTS

In general, the invention concerns a CMOS PLL using a ring oscillator VCO, with the ring oscillator periodically realigned to the reference signal of the PLL. A buffered version of the reference signal is used to periodically correct the VCO, addressing the noise introduced by a VCO due to the build up over time of zero crossing errors contributed by each inverter in the VCO. The reference signal is fed into the VCO at a point in time where a signal edge in the VCO ideally coincides with a reference signal edge. The VCO signal, which might normally have its edge out of phase due to the noise induced phase fluctuations, is pulled toward the reference signal edge thereby suppressing the memory of the past phase errors and reducing phase noise.

A preferred embodiment of the invention is a CMOS PLL for a particular type of Bluetooth transceiver. This embodiment will be discussed in some detail, as an illustration of the embodiment itself. However, artisans will understand broader aspects of the invention from the embodiment and will understand that the invention is not limited to specific aspects of the preferred embodiment for a next generation Bluetooth device. The exemplary embodiment is intended to be applied to a 96 MHz reference PLL, which is designed for a next generation of the Bluetooth transceiver described in the Silicon Wave SiW1502 Bluetooth Radio Modem IC Data Sheet, Nov. 3, 2000. The exemplary embodiment facilitates operation from the conventional popular crystal reference frequencies. The exemplary application requires CMOS components, a ring oscillator VCO to avoid external components, and that its phase noise between 1 KHz and 50 kHz from the carrier be below −100 dBc/Hz (the loop bandwidth of the RF PLL is 50 kHz). Measured VCO noise from 100 kHz from the carrier is −107 dBc/Hz, requiring a conventional ring oscillator VCO PLL to have a loop bandwidth of approximately 100 kHz to sufficiently suppress the VCO noise with enough margin left to allow for phase noise from other PLL components. In a conventional ring oscillator VCO, the reference frequency is obtained by dividing each crystal frequency to the greatest common divisor of 96 MHz, but to maintain stability over process and temperature extremes, the PLL reference frequency must be approximately 20 times the loop bandwidth. Among the commonly used crystal references, this implies that the target phase noise may not be achieved for 19.68 and 19.8 MHz crystals. This problem is avoided in the preferred embodiment.

Figure 1:
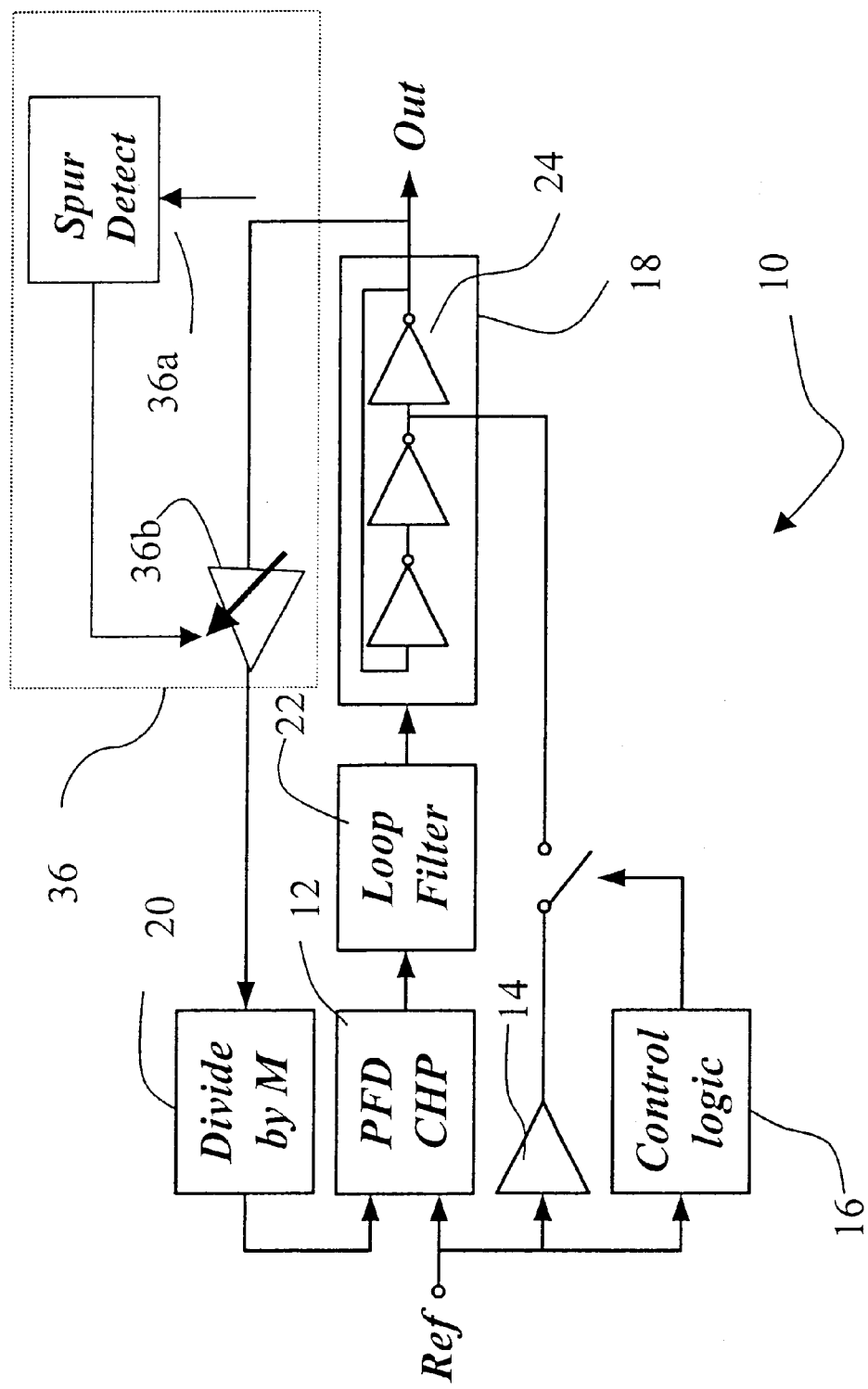
FIG. 1 is a block diagram of a preferred phase locked loop with voltage controlled oscillator realignment.

Referring now to FIG. 1, the preferred embodiment PLL 10 is shown. The reference signal is input to a phase and frequency detector (PFD) and a charge pump (CHP) 12, a buffer 14, and a control logic circuit 16. The PFD/CHP 12 translates a phase difference between the reference and a divided output of a ring oscillator VCO 18 into a current that is proportional to the phase difference. The divided VCO output is provided from a divide by M circuit 20. A loop filter 22 converts the current from the PFD/CHP 12, which reflects the phase difference between the reference and a divided output of the VCO 18, into a control voltage to control the VCO 18. Together, the PFD/CHP 12 and loop filter 22 form a control voltage circuit to control the VCO 18.

The ring oscillator VCO 18 is noisy. If left to operate without correction, the ring oscillator VCO tends to accumulate the phase fluctuations caused by the noise in its inverters. Referring to FIG. 2A, phase noise in the output waveform of a ring oscillator VCO accumulates over time because zero crossing errors introduced by each inverter adds to all previous zero crossing errors. The variation of the VCO zero crossing time from its ideal value increases, which is represented by the increase in the gray areas in FIG. 2A due to the zero crossing errors. The PLL 10 accounts for these errors and corrects the VCO waveform. Specifically, the control logic circuit 16 shorts the version of the reference signal that is buffered by buffer 14 into the VCO 18 periodically to pull the VCO waveform edges toward their ideal correct position vis a vis the reference signal. Preferably, the control logic circuit 16 shorts the buffered version of the reference signal to the VCO at each point (in time) where a VCO waveform edge ideally coincides with an edge of the reference signal. The buffered signal is shorted to an inverter other than the inverter 24 from which the PLL output is taken, i.e., the last inverter in the VCO. Accordingly, the VCO waveform edge is pulled toward its ideal position thereby suppressing the memory of past errors and reducing phase noise.

The resulting correction in the preferred embodiment is illustrated in FIGS. 2B–2D). In the example waveforms, the buffered signal (of FIG. 2C) is shorted by the control logic circuit 16 periodically according to the control signal (of FIG. 2D), with the period corresponding to the period of the reference signal, to realign the phase of the output (FIG. 2B) of the VCO 18, which is also the output of the PLL 10. In other applications, a less frequent realignment may suffice. In any application, the control and logic circuit 16 creates the signal path for the buffered version of the reference signal from the buffer 14 for a sufficient period to account for the delay by the buffer.

An exemplary physical embodiment has been constructed. A simplified circuit diagram of the exemplary realigned VCO 25 is shown in FIG. 3A. A circuit schematic for inverters 26 in the VCO is shown in FIG. 3B. The VCO 25 is a 7-stage ring oscillator having 7 inverters 26 wherein 4 of the 7 inverters are used to control the frequency and 3 introduce a fixed delay. The separation was made to minimize charge injection from the realignment switches 30 (responsive to or part of control logic) into the sensitive VCO control node 32, i.e., the node where the signal from the PFD/CHP 12 is received. Although not shown in the figure, the supply voltage on the fixed inverters is level shifted to 1.5 volts so as to approximately match the drain voltage of the VCO frequency control transistor 34. As illustrated in FIG. 3C, the realignment process does not perfectly align the VCO and reference edges. Instead, circuit simulation and experimental measurements indicate that during each realignment the phase of the VCO is adjusted almost linearly by a factor off β=0.5 times the difference between the actual and ideal VCO phases.

Figure 4A:
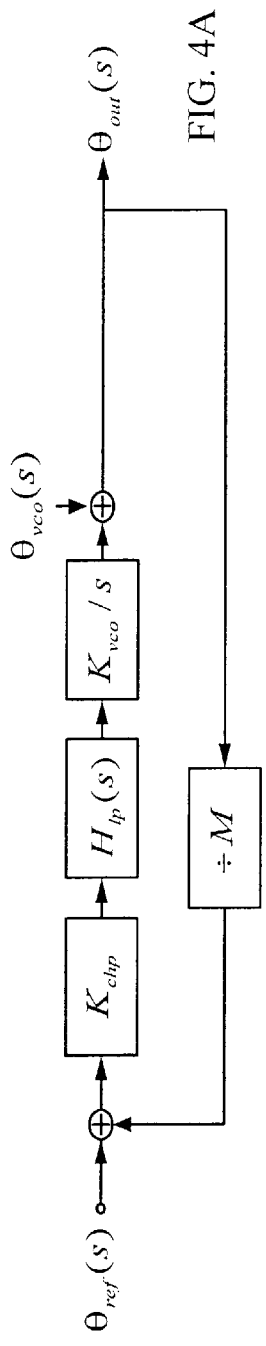
FIG. 4A is a block diagram of the commonly used phase noise model of a conventional integer-N PLL.

Without the realignment technique, the PLL phase noise, $\theta_{out}(s)$, is described by the well known linearized model shown in FIG. 4A, where $\theta_{ref}(s)$ is the phase noise of the reference source, $\theta_{vco}(s)$ is the phase noise of the VCO without realignment, $K_{chp}$ and $K_{vco}$ are the charge pump and VCO gains, respectively, and $H_{lp}(s)$ is the transfer function of the PLL loop filter. See, F. Gardner, *Charge-pump phase-lock loops*, IEEE Trans. Comm, vol 28, no. 11, pp.

Figure 4B:
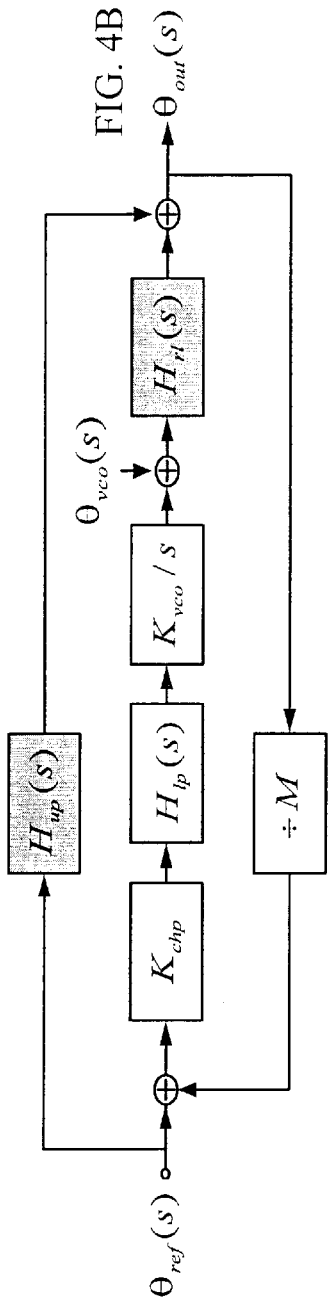
FIG. 4B is a modified version of the phase noise model describing the realigned PLL.
Figure 4C:
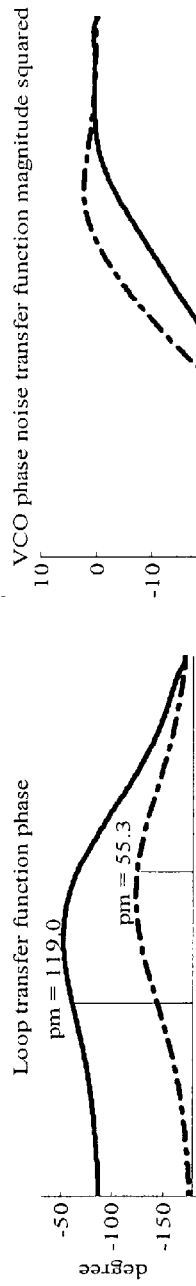
FIGS. 4C–4E compares plots of the loop and VCO phase noise transfer functions from the two models in FIGS. 4A and 4B.
Figure 4D:
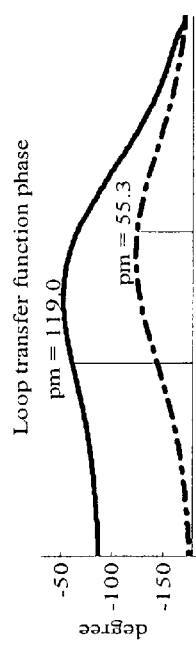
Figure 4E:

1849–1858, November 1980. With the realignment technique, assuming the realignment behavior described above occurs abruptly at each reference edge, an extension of the derivation of FIG. 4A indicates that the model contains two new blocks as shown in FIG. 4B:

$$H_{rl}(j\omega) = 1 - \frac{\beta e^{-j\omega T_{ref}/2}}{1+(\beta-1)e^{-j\omega T_{ref}}} \cdot \frac{\sin(\omega T_{ref}/2)}{\omega T_{ref}/2}, \text{ and}$$

$$H_{up}(j\omega) = \frac{M\beta e^{-j\omega T_{ref}/2}}{1+(\beta-1)e^{-j\omega T_{ref}}} \cdot \frac{\sin(\omega T_{ref}/2)}{\omega T_{ref}/2},$$

where $T_{ref}$ is the reference period. FIGS. 4C–4E show a comparison of the loop and VCO phase noise transfer functions for the implemented PLL with realignment disabled ($\beta=0$) and realignment enabled ($\beta=0.5$). As is evident from the figures, the realigned PLL differs from the conventional PLL in that the VCO phase noise contribution is significantly reduced, the phase margin of the loop is increased, and the reference source phase noise contribution is slightly increased.

Figure 5:
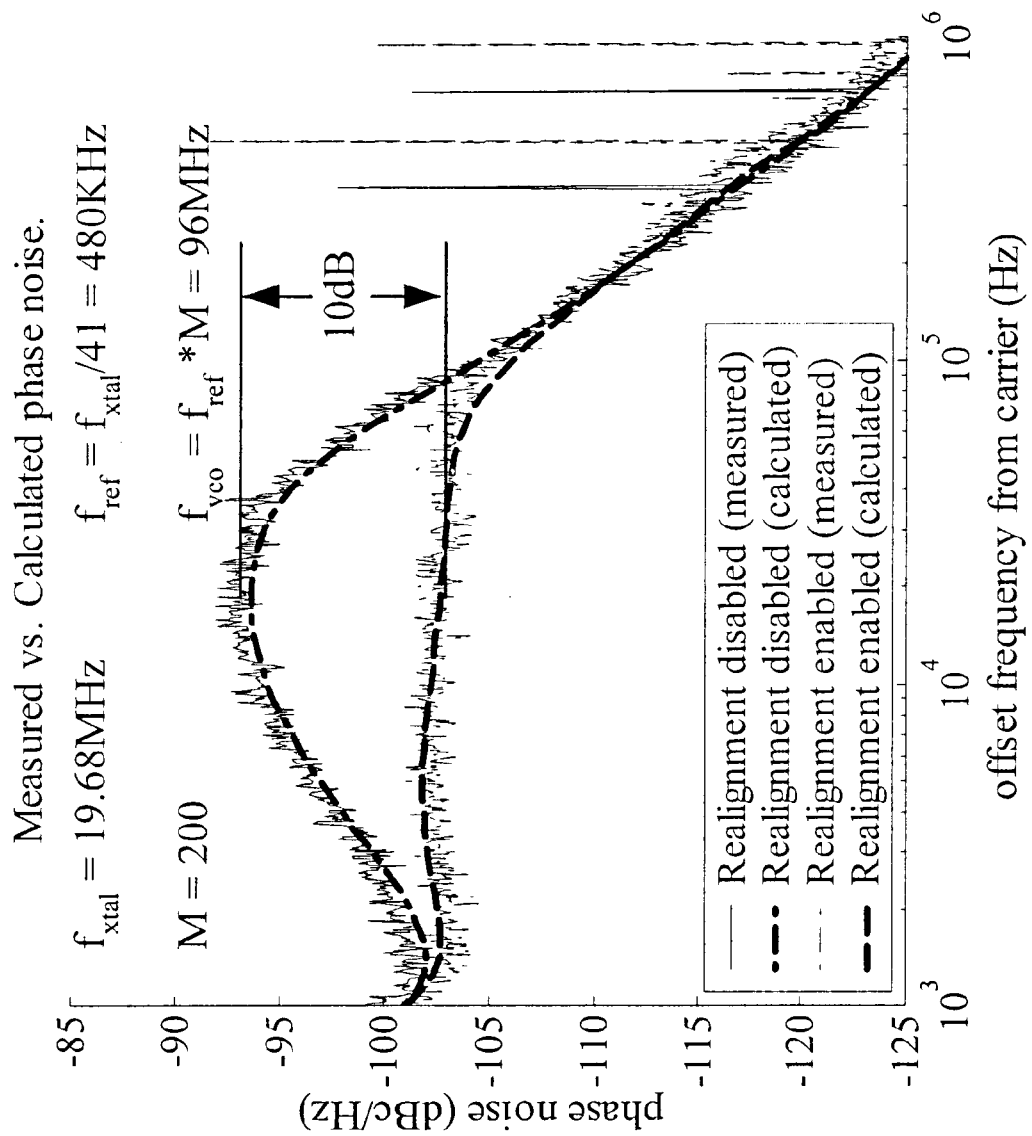
FIG. 5 shows measured and theoretical power spectral density (PSD) plots of the PLL phase noise with the realignment of the invention enabled and disabled for a crystal frequency of 19.68 MHz and a loop bandwidth of 25 kHz.

Measured data closely support these findings. FIG. 5 shows measured and theoretical power spectral density (PSD) plots of the PLL phase noise with the realignment of the invention enabled and disabled for a crystal frequency of 19.68 MHz and a loop bandwidth of 25 kHz. Similar results were observed for the other crystal frequencies. The results indicate that the realignment reduces the peak in-band phase noise by 10 dB, and reduces the phase noise integrated from 1 to 50 kHz by 8.3 dB. When the loop bandwidth was increased to a less conservative 50 kHz, which is near the maximum value prior to instability, the integrated phase noise improvement changed from 8.3 dB to 5.3 dB. These results indicate that the realignment significantly reduces the PLL phase noise contributed by the VCO. However, mismatches between the two reference signal paths increase the power of the reference spur in the PLL output. The measured reference spur power was −34 dBc with the technique enabled, and −78 dBc with the technique disabled.

Increased reference spur power may be a drawback in some applications, but may be addressed with use of an automatic calibration loop 36. The calibration loop 36, includes a spur detector 36a to detect the delay mismatch that causes the spur. The spur detector 36a changes a voltage controlled delay cell's 36b delay to compensate for the mismatch. The goal is to reduce the power of the spur. The spur detector 36a takes the output of the PLL 10 and generates a control voltage. The control voltage is turned into a delay through the voltage controlled delay cell 36b to compensate for the delay mismatch in the two reference signal paths and therefore reduce the spur power. The first signal path is from the reference signal to the PFD/CHP 12. The second signal path is from the reference signal through the buffer 14, the inverters in the VCO 18, the voltage controlled delay cell 36b and the divide by M circuit 20.

An automatic path calibration loop was simulated in the exemplary physical embodiment VCO with a variable delay element prior to the divider to allow for such calibration. With this feature enabled and manually calibrated, the measured spur power was −71 dBc and static. The total power consumed by the PLL was measured at 6.8 mW with no observable difference when the realignment technique was disabled. FIG. 5 compares measured and calculated (theoretical) PSD plots with and without realignment. The theoretical PSD plots were obtained by applying the phase noise models in FIG. 4A and FIG. 4B to measured PSD plots of the phase noise from the VCO and reference source in isolation. A good match between theory and measurement is evident.

Figure 6A:
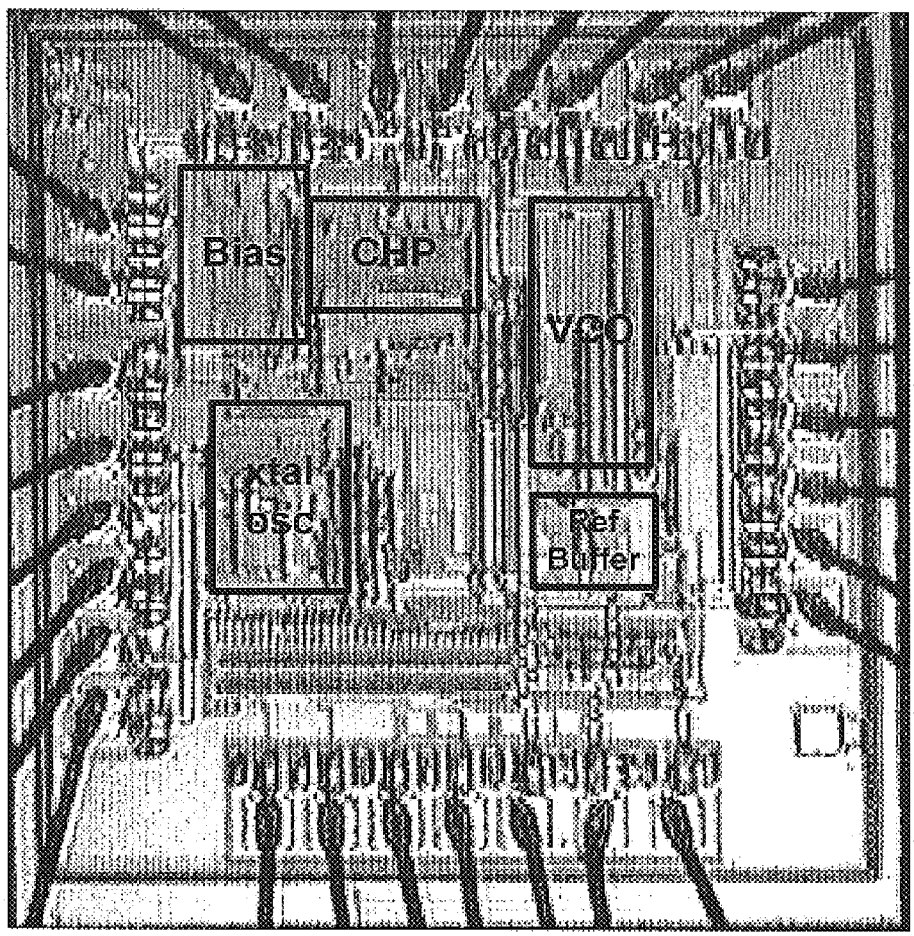
FIG. 6A is a die micrograph of an exemplary physical embodiment phase locked loop according to the invention.

FIG. 6A is a die micrograph of an exemplary physical embodiment phase locked loop according to the invention. The exemplary physical embodiment exhibited good performance. FIG. 6B is a performance summary concerning the exemplary physical embodiment phase locked loop shown in FIG. 6A.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for realigning phase of a CMOS ring oscillator voltage controlled oscillator in a phase locked loop, the method comprising steps of:

buffering a reference signal used by the phase locked loop as a synchronization reference; and periodically shorting the buffered reference signal into an intermediate inverter in the voltage controlled oscillator to realign a waveform of the voltage controlled oscillator by realigning edges in the waveform toward their ideal correct position.

2. The method according to claim 1, wherein said step of periodically shorting shorts the buffered reference signal into the voltage controlled oscillator when an edge in the waveform ideally coincides with an edge of the reference signal.

3. The method according to claim 2, wherein said step of periodically shorting shorts the buffered reference signal into the voltage controlled oscillator at each point when an edge in the waveform ideally coincides with an edge of the reference signal.

4. A CMOS phase locked loop comprising:

a ring oscillator voltage controlled oscillator;

means for producing a voltage proportional to a phase difference between an output of the voltage controlled oscillator and a reference signal and for providing said voltage as a control voltage to a control node of said voltage controlled oscillator; and means for realigning said voltage controlled oscillator to the reference signal by selectively providing a realignment signal to the voltage controlled oscillator.

5. A CMOS phase locked loop comprising:

a ring oscillator voltage controlled oscillator;

means for producing a voltage proportional to a phase difference between an output of the voltage controlled oscillator and a reference signal and for providing said voltage as a control voltage to a control node of said voltage controlled oscillator; and means for realigning said voltage controlled oscillator to the reference signal, wherein said means for realigning periodically shorts a buffered version of the reference signal into an intermediate inverter of said voltage controlled oscillator.

6. A CMOS phase locked loop comprising:

a ring oscillator voltage controlled oscillator;

a divide by M circuit driven by an output of the voltage controlled oscillator;

a control voltage circuit accepting a reference signal and a signal from said divide by M circuit, said control voltage circuit producing a control voltage proportional to a phase difference between the output of the voltage controlled oscillator and the reference signal and providing the control voltage to a control node of said voltage controlled oscillator;

a realignment circuit responsive to the reference signal, the realignment circuit providing a realignment signal into an intermediate inverter of the voltage controlled oscillator when an edge in the waveform of the voltage controlled oscillator ideally coincides with an edge of the reference signal.

7. The CMOS phase locked loop of claim 6, wherein said realignment circuit comprises:

a buffer between the reference signal and said realignment circuit; and control logic responsive to the reference signal and controlling output of said buffer into the intermediate inverter of the voltage controlled oscillator to a timing when edges in the waveform of the voltage controlled oscillator ideally coincide with an edge of the reference signal.

8. The CMOS phase locked loop of claim 7, wherein said control logic controls output of said buffer into the intermediate inverter of the voltage controlled oscillator to a timing for every edge in the waveform of the voltage controlled oscillator that ideally coincides with an edge of the reference signal.

9. The CMOS phase locked loop of claim 6, further comprising an automatic calibration loop between said voltage controlled oscillator and said divide by M circuit to reduce spur power.

10. The CMOS phase locked loop of claim 9, wherein said automatic calibration loop comprises a spur detector that detects spur power and generates a control voltage to control a voltage controlled delay cell disposed in a signal path between said voltage controlled oscillator and said divide by M circuit.

* * * * *